(12) United States Patent
Ding et al.

(10) Patent No.: US 8,773,530 B2
(45) Date of Patent: Jul. 8, 2014

(54) UP-LOOK CAMERA BASED VISION APPARATUS TO AUTO ALIGN PICK-AND-PLACE POSITIONS FOR DEVICE HANDLERS

(75) Inventors: Kexiang Ken Ding, San Diego, CA (US); Michael Anthony Laver, El Cajon, CA (US); Alton R. Lindsey, Jr., El Cajon, CA (US)

(73) Assignee: Delta Design, Inc., Poway, CA (US)

( * ) Notice: Subject to any disclaimer, the term of this patent is extended or adjusted under 35 U.S.C. 154(b) by 370 days.

(21) Appl. No.: 13/048,638

(22) Filed: Mar. 15, 2011

(65) Prior Publication Data

US 2011/0228080 A1      Sep. 22, 2011

Related U.S. Application Data

(60) Provisional application No. 61/314,983, filed on Mar. 17, 2010.

(51) Int. Cl.
  *H04N 7/18*   (2006.01)
  *G06K 9/00*   (2006.01)
  *G06F 19/00*  (2011.01)

(52) U.S. Cl.
  CPC .. *H04N 7/18* (2013.01); *G06K 9/00* (2013.01); *G06F 19/00* (2013.01)
  USPC .............. 348/135; 348/95; 348/180; 348/190

(58) Field of Classification Search
  CPC ............. H04N 7/18; G06K 9/00; G06F 19/00
  USPC .................... 348/135, 95, 180, 190
  See application file for complete search history.

(56) References Cited

U.S. PATENT DOCUMENTS

| | | | |
|---|---|---|---|
| 6,550,669 B1 * | 4/2003 | Walz et al. ..................... | 228/264 |
| 7,842,912 B2 * | 11/2010 | Ding et al. ................. | 250/222.1 |
| 8,106,349 B2 * | 1/2012 | Ding et al. ................. | 250/222.1 |
| 8,135,208 B1 * | 3/2012 | Vangal-Ramamurthy .... | 382/153 |
| 2004/0062104 A1 * | 4/2004 | Muller et al. ................. | 365/201 |
| 2004/0260422 A1 * | 12/2004 | Greenwood et al. .......... | 700/193 |

\* cited by examiner

*Primary Examiner* — Jessica Roberts
(74) *Attorney, Agent, or Firm* — Foley & Lardner LLP

(57) ABSTRACT

A method of pick-and-place alignment comprises (a) determining a pick location of a device from a tray of devices; (b) determining place location of the device using an up-looking camera; and (c) determining offset error for the device by comparing the pick location and the place location. The method may further comprise repeating steps (a)-(c) for additional devices on the tray of devices; and generating an offset map for alignment of devices on the tray. The method further uses the offset map to make pick and place corrections during runtime.

17 Claims, 9 Drawing Sheets

Fig. 4

| (x0,y0) | (x1,y1) | (x2,y2) |
|---|---|---|
| (x3,y3) | (x4,y4) | (x5,y5) |
| (x6,y6) | (x7,y7) | (x8,y8) |
| (x9,y9) | (x10,y10) | (x11,y11) |
| (x12,y12) | (x13,y13) | (x14,y14) |
| (x15,y15) | (x16,y16) | (x17,y17) |
| (x18,y18) | (x19,y19) | (x20,y20) |

Fig. 5

| (dx0,dy0) | (dx1,dy1) | (dx2,dy2) |
|---|---|---|
| (dx3,dy3) | (dx4,dy4) | (dx5,dy5) |
| (dx6,dy6) | (dx7,dy7) | (dx8,dy8) |
| (dx9,dy9) | (dx10,dy10) | (dx11,dy11) |
| (dx12,dy12) | (dx13,dy13) | (dx14,dy14) |
| (dx15,dy15) | (dx16,dy16) | (dx17,dy17) |
| (dx18,dy18) | (dx19d,y19) | (dx20,dy20) |

UP-LOOK CAMERA BASED VISION APPARATUS TO AUTO ALIGN PICK-AND-PLACE POSITIONS FOR DEVICE HANDLERS

CROSS-REFERENCE TO RELATED APPLICATIONS

This application claims the benefit of U.S. Provisional Application No. 61/314,983, filed on Mar. 17, 2010, which is incorporated herein by reference in its entirety.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Semiconductor backend process equipment (e.g., IC Handlers) require device pick-and-place machine alignments. Typically, these alignments are achieved through a manual process using some human involvement. This process is error-prone, cumbersome, time-consuming and subjective. It is desirable for this alignment process to be simplified and automated.

SUMMARY OF THE INVENTION

In accordance with embodiments of the present invention, an up-looking camera may be located underneath the pick-and-place mechanism. Thus, in accordance with embodiments of the present invention, a vision-based apparatus automates the alignment process with actual IC devices.

In one aspect, a method comprises (a) locating a head of a pick-and-place device using an up-looking camera; (b) locating a test device using the up-looking camera, the test device being picked up by the pick-and-place device from a tray having the one or more test devices; and (c) determining offset error by comparing the location of the head with the location of the test device.

In one embodiment, the method further comprises repeating (a)-(c) for additional test devices on the tray; and generating an offset map for alignment of the one or more devices in the tray.

In another embodiment, the method further comprises repeating (a)-(c) for a test device corresponding to each corner of the tray; mapping each corner of the tray to actual pocket location of the test device corresponding to the corner by using the offset error for that corner; and generating an offset map for alignment of the one or more devices in the tray.

In one embodiment, the offset map is a look-up table.

In one embodiment, the head is located by using fiducials on the head of the pick-and-place device and fiducials on a fixed frame.

In one embodiment, locating the head includes locating a center of the head, and locating the test device includes locating a center of the test device.

In another aspect, an apparatus comprises a pick-and-place device having a pick-and-place head and a frame, the head and the frame each having fiducials; an up-looking camera positioned to include the frame in a field of view of the up-looking camera; and a processor. The processor is configured to (a) locate the head using the up-looking camera; (b) locate a test device using the up-looking camera, the test device being picked up by the pick-and-place device from a tray having the one or more test devices; and (c) determining offset errors by comparing the location of the head with the location of the test device.

In another aspect, a method of pick-and-place alignment comprises picking a device from a pick location of a device from a tray of devices; determining a correction for a place location based on a pick offset and a place offset, the pick offset and place offset being determined from offset maps; and placing the device at a corrected place location.

In one embodiment, the offset maps have been generated by (a) locating a head of a pick-and-place device using an up-looking camera; (b) locating a test device using the up-looking camera, the test device being picked up by the pick-and-place device from a tray having the one or more test devices; (c) determining offset error by comparing the location of the head with the location of the test device; (d) repeating (a)-(c) for additional test devices on the tray; and (e) generating an offset map for alignment of the one or more devices in the tray.

In one embodiment, the corrected place location is based on a nominal place location and the correction.

In another aspect, an apparatus comprises a pick-and-place device having a pick-and-place head; and a processor. The processor is configured to pick a device from a pick location of a device from a tray of devices; determine a correction for a place location based on a pick offset and a place offset, the pick offset and place offset being determined from offset maps; and place the device at a corrected place location.

BRIEF DESCRIPTION OF THE DRAWINGS

Embodiments of the invention are described by referring to the attached drawings, in which:

FIG. 4 illustrates a position map of devices in a tray;

FIG. 5 illustrates a device offset map for a tray;

DETAILED DESCRIPTION OF THE CERTAIN EMBODIMENTS

In the following description, for purposes of explanation and not limitation, details and descriptions are set forth in order to provide a thorough understanding of the present invention. However, it will be apparent to those skilled in the art that the present invention may be practiced in other embodiments that depart from these details and descriptions.

In accordance with embodiments of the present invention, an up-looking camera is located underneath the pick-and-place mechanism. Thus, a vision-based apparatus automates the alignment process with actual IC devices.

Figure 1:
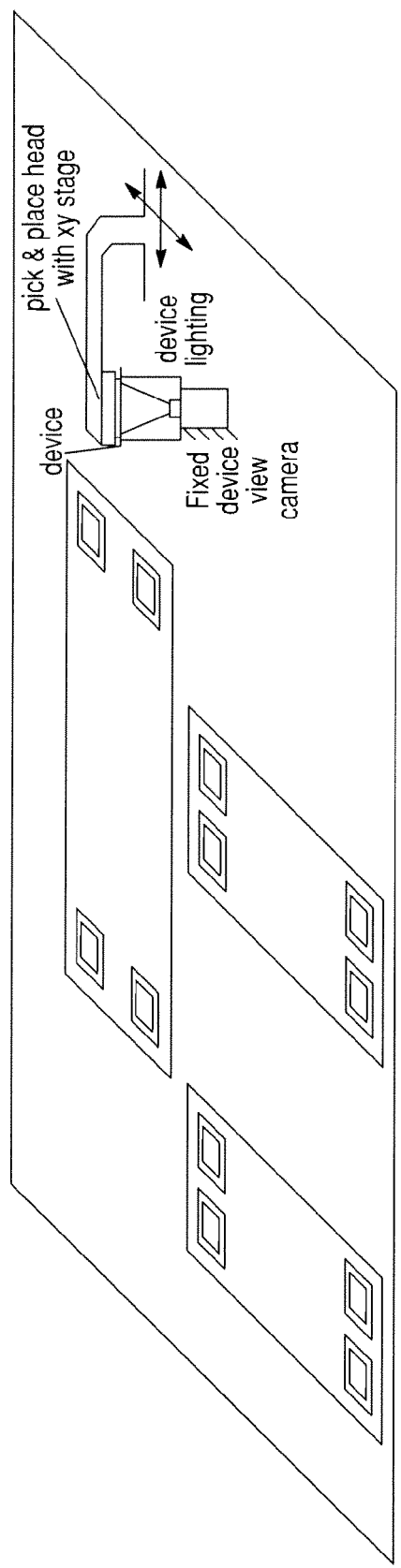
FIG. 1 is a schematic illustration of a single, up-look camera-based vision system for pick-and-place alignment.

A single, up-look camera-based vision alignment system for aligning multiple pick-and-place (PnP) trays and shuttles is schematically illustrated in FIG. 1. The camera is mounted at a fixed position. The device, such as an integrated circuit (IC) device, is picked up from one coordinate and placed at another coordinate. Each coordinate could be the coordinate system of a tray or a shuttle.

To simplify multiple coordinate systems, a common coordinate system is used on the machine. In certain embodiments, the common coordinate system is the x-y stage coordinate system for the pick-and-place mechanism. Thus, all other coordinates can be mapped into the common coordinate system.

The pick-and-place mechanism may be a gantry robot. On the pick up head of the pick-and-place mechanism, pitch changeable nozzles are used to pick and place multiple devices with different pitches. Therefore, the x-y gantry stage acts as the arm of the robot and the pitch changeable nozzles act as the pick up fingers on the robot. Usually, the gantry stage and pitch changeable nozzles can be considered as using two different coordinate systems. The combination of the two coordinate systems represents the pick and place position.

During runtime, the calculation of the picking and placing positions is complicated and the errors are accumulated. However, if the picking nozzle pitch is fixed and the placing nozzle pitch is fixed as well, the picking position and the place position can be determined by the combined coordinates during the calibration time to create the offset map. During runtime, the offset map with the combined coordinate system is directly used. There are no separate calculations for the two coordinate systems for different situations. This process simplifies the calculations and reduces the accumulation errors.

Since the actual devices in-pocket represent the true pick and place positions, it is ideal to use the real IC devices rather than an alignment target with fiducials. As used herein, "fiducials" may refer to markings, points or other visual objects that may be identified by a robot, machine or other electronic device or software. Use of the real IC devices also simplifies the alignment process and reduces the need to purchase a costly alignment target.

In accordance with one embodiment, a calibration process is used to generate an offset map which may be used in a run-time, pick-and-place alignment process. One embodiment of the calibration process includes the following steps:

1. Locate PnP head center.
2. Locate IC device centers.
3. Determine offset error by comparing the device center to PnP head center.
4. Use offset error with actual pocket location to map four shuttle/Jedec tray corner positions. Repeat steps 2 through 4 until all shuttle and Jedec tray corners are located.
5. Generate offset maps that are used for final alignment corrections during runtime.

Each of these steps is described in greater detail below.

Step 1. Locate PnP Head Center

Figure 2:
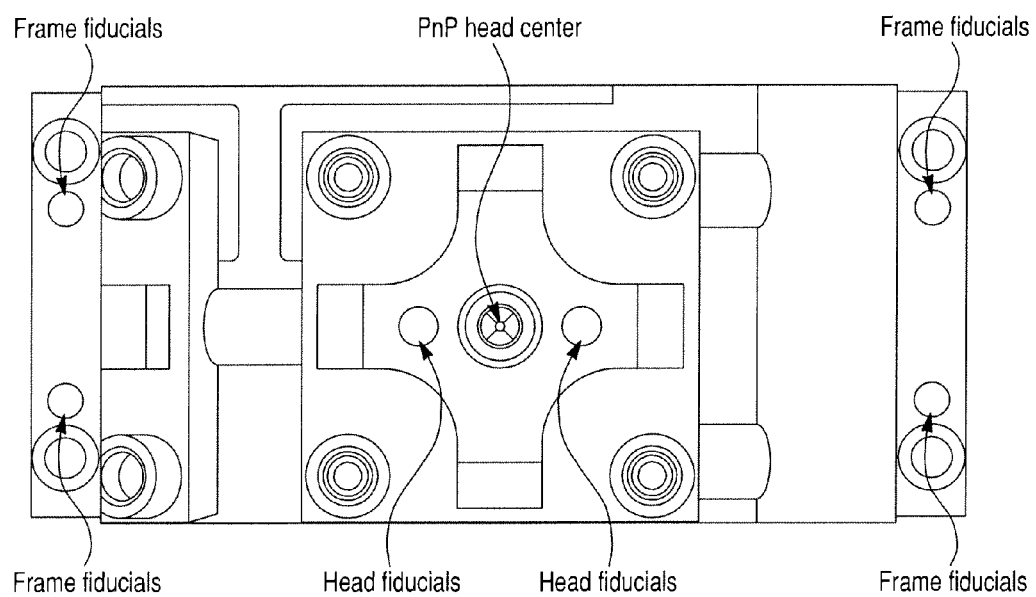
FIG. 2 is a pictorial illustration of a pick-and-place (PnP) head and fiducials.

Two fiducials are used on the PnP head to define the head center location as shown in FIG. 2.

To prevent camera drift due to machine vibration, thermal expansion and other causes, a fixed mechanical frame with fiducials is mounted on the system datum plate located in the camera's field of view (See FIG. 2). Frame fiducials represent the physical machine frame. Although the camera image center can drift from the machine frame, the error is measured and compensated for all vision measurements.

Step 2. Locate IC Device Center

Figure 3:
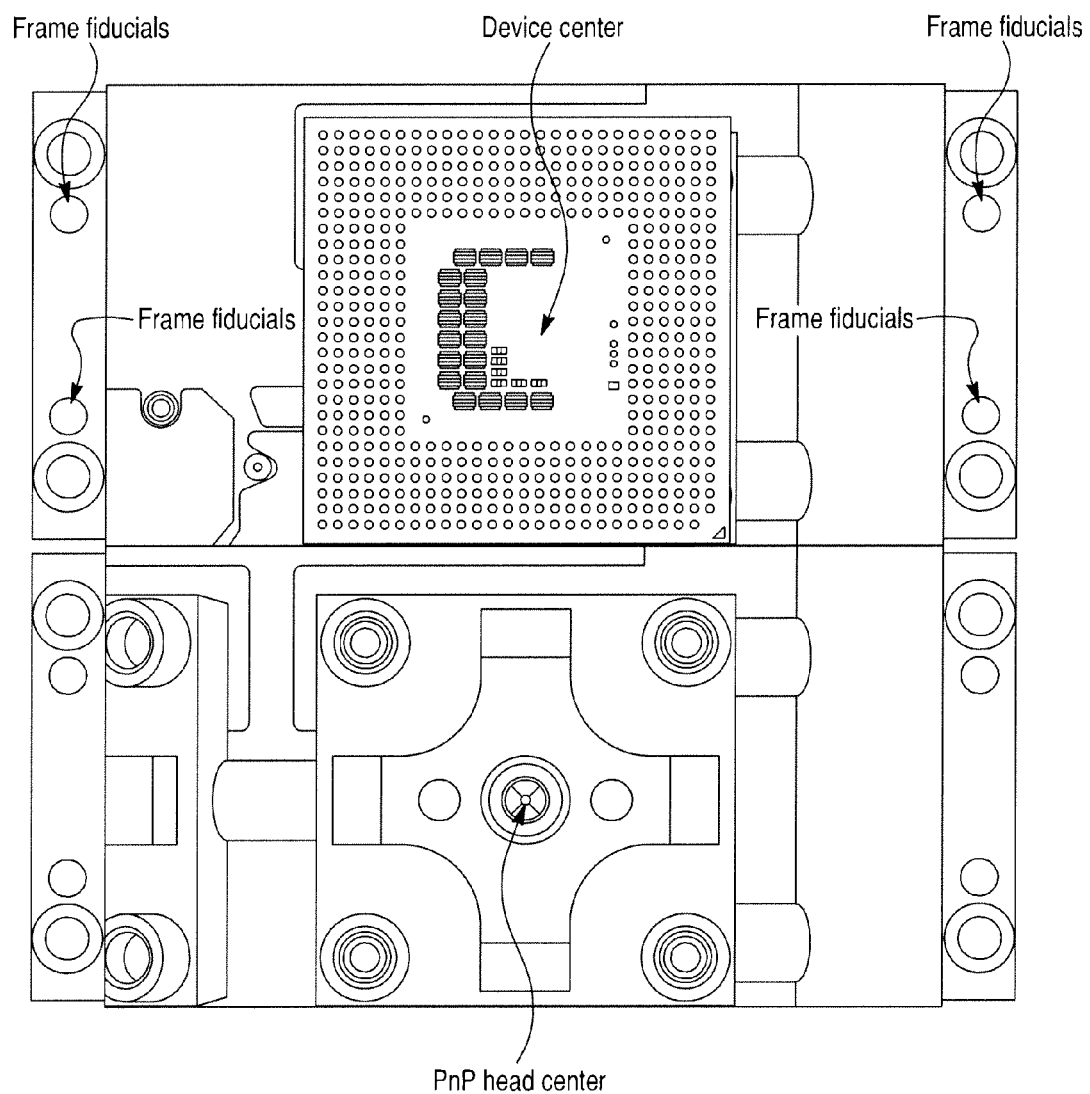
FIG. 3 illustrates the center offset between PnP head and a device in the frame fiducial coordinates.

A pick pocket location on a tray or a shuttle is initially calculated based on the mechanical design model. When the PnP head picks up a device, the actual location will be slightly different from the ideal model pocket location due to the tolerance stack. The device can be located from the PnP head center using the camera (see FIG. 3). In this regard, a pattern associated with the device may be used in conjunction with the frame fiducials to locate the device.

Step 3. Compare PnP Center with IC Device Center to Determine Offset Errors

The device-to-head location difference is called pick error offset. Therefore, as long as the device can be physically picked up and moved over the camera's field of view, the pick error offset ($\Delta x$, $\Delta y$) can be captured by the camera. This offset is used for the picking error correction to align the PnP head more accurately over the pocket center while picking the device in the pocket. Preferably, multiple pick and place measurements are averaged to reduce the impact of random errors.

Step 4. Use Offset Error with Actual Pocket Location to Map Four Corner Positions of Each Shuttle or Jedec Tray Based on the above system descriptions, the nominal position map for a tray is initially created using the mechanical design model as exemplarily shown in FIG. 4. To get the CORRECTION (pick & place), the OFFSET (pick device) and the OFFSET (place device) for each tray or shuttle with each PnP head needs to be determined as in FIG. 5.

To get offset map on each tray, in one embodiment, the pick error offsets at four corners of the tray can be measured and all offsets in the other pockets on the tray can be calculated.

Since a PnP head for each tray or shuttle has its fixed pitch, the PnP head-to-head distance does not need to be included in the offset map. The distance is only used to roughly pick the device and to bring it to the camera field of view.

The origin differences between different heads for the same tray represent the head pitches. Other than the origin difference, the different maps for different head on the same tray should be similar. It can also be used to verify the maps to each other or to use Least Mean Square principle to get the best match maps.

Since all placing pockets are also treated as picking pockets for pick-and-place alignment, only the OFFSET (pick device) for each pocket of a tray or a shuttle needs to be determined.

To ensure the head offset can be canceled out (as in equation 3(b) below), when the head or device is moved above the camera, the PnP head pitch during imaging should be the same as the trained pitch for trays or shuttles.

Figure 6:
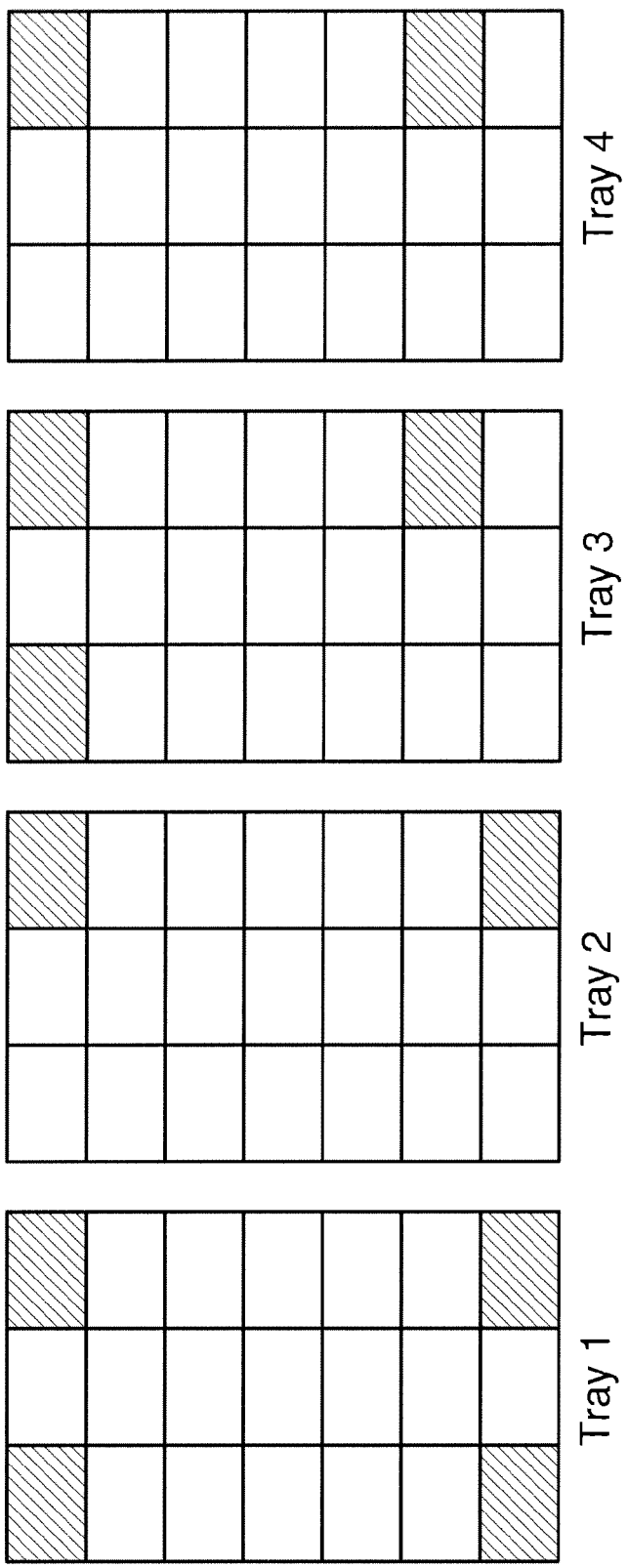
FIG. 6 illustrates a device tray arrangement with golden device pockets on the tray.
Figure 7:
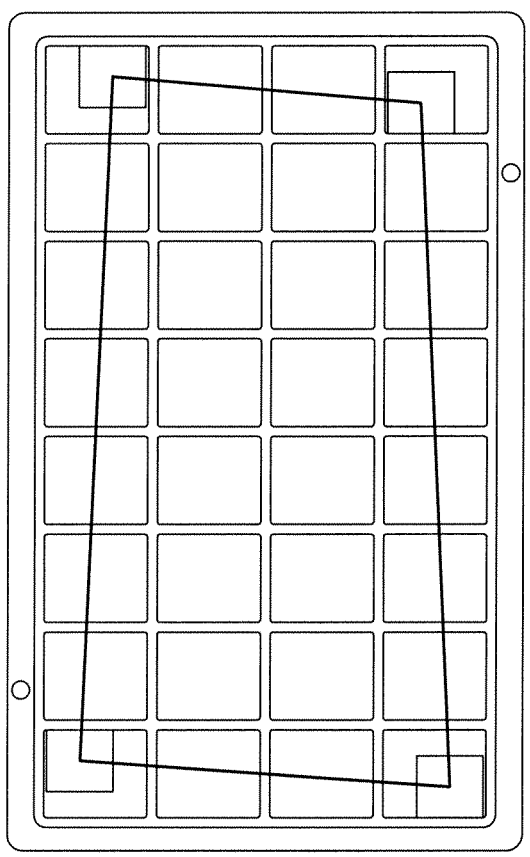
FIG. 7 illustrates a four-device approach for pick-and-place alignment in accordance with an embodiment of the present invention.

To determine the offset for all pockets on a tray or a shuttle, four "golden" devices may be placed on the corner pockets of a tray or a shuttle at the predefined locations, as shown in Tray 1 of FIG. 6. These devices are used to measure the tray alignment relative to the x, y gantry. Using a two-device approach (as illustrated by Tray 2 of FIG. 6) may produce faster results, but is less accurate since it assumes x and y motions are orthogonal. A three device approach (as illustrated by Tray 3 of FIG. 6) considers the tray/shuttle may not be orthogonal, but it still assumes the four corner devices on the tray are at the vertices of the parallelogram. The four-device approach (as illustrated by Tray 1 of FIG. 6) is more accurate without assuming the x and y motions are orthogonal or the four corner devices on the tray are at the vertices of a parallelogram, as illustrated in FIG. 7. With the worst case scenario, all pocket locations on the tray are still able to be calculated in pocket.

Step 5. Generate Offset Map for Use for Final Corrections

Once PnP head and device image pattern is trained and above pockets are setup with golden devices for all trays and shuttles, a user can click on one alignment button on the software user interface to generate the offset maps.

A linear transform with Least Mean Square (LMS) best fitting model is used to create the offset maps for trays and shuttles.

Once calibrated and the offset errors (offset maps) are generated, the offset maps may be used to correct pick-and-place alignment during runtime. The IC handler may use the offset maps (e.g., look-up table) to make the correction from the nominal position on the fly between pick and placement.

The offsets in the offset maps for each picking pocket and each placing pocket are generated during the calibration time. During runtime, after the handler determines the picking and placing pockets of a device, the system will obtain the pocket offsets from the picking and placing offset maps. The pick and place head correction is obtained by subtracting the placing pocket offset from the picking pocket offset. The following formulas show the calculations step by step.

There are three formulas used to determine PnP offset correction for alignment:

OFFSET(pick pocket)=OFFSET(pick device)+OFFSET(head); and  1)

OFFSET(place pocket)=OFFSET(place device)+OFFSET(head).  2)

Therefore,

CORRECTION(pick to place)=OFFSET(place pocket)−OFFSET(pick pocket);  3a)

CORRECTION(pick to place)=OFFSET(pick device)+OFFSET(head)−OFFSET(place device)−OFFSET(head);  3b)

Since the head used for pick and place is the same head, the OFFSET (head) is canceled out. Therefore, CORRECTION(pick to place)=OFFSET(place device)−OFFSET(pick device).  3c)

Above formulas apply to picking and placing single or multiple devices. When picking and placing more than one device at a time, the pitch between devices should be fixed such that all devices can be picked or placed in a single operation. The fixed pitch on the pick and the fixed pitch on the place can be different corresponding to the shuttle and Jedec tray pitches.

Since each head to each tray is calibrated separately, the pitch geometrical location is calibrated with the PnP arm. Therefore, the additional pitch measurement is not needed. It eliminates any accumulated errors from the pitch measurements and calculations.

In various embodiments, the system may include various components. In one embodiment, the system includes cameras with lighting, pick-and-place handler and software with vision algorithms.

With regard to the cameras with lighting, to find the offsets, one device view camera is included. The lighting used in one embodiment is a three-channel programmable LED array light. The light angle can be changed from 0, 45 to 90 degrees with changes of intensities. Any other lighting that provides good contrast of images can be used as alternatives.

With regard to pick-and-place handling, a pick-and-place handling system is used to pick a device to the device view camera.

With regard to the software, the software sequence for the alignment may include:

a. move PnP head without device to camera location and image and save PnP head pattern and frame fiducial patterns;

b. move PnP head with device to camera location and image and save device pattern and frame fiducial patterns;

c. during the calibration process, image the selected devices for all trays or shuttles and generate the offset map; and d. during runtime, pick and place handler combine the pick and place offset maps on the fly to ensure the correct placement.

Figure 8:
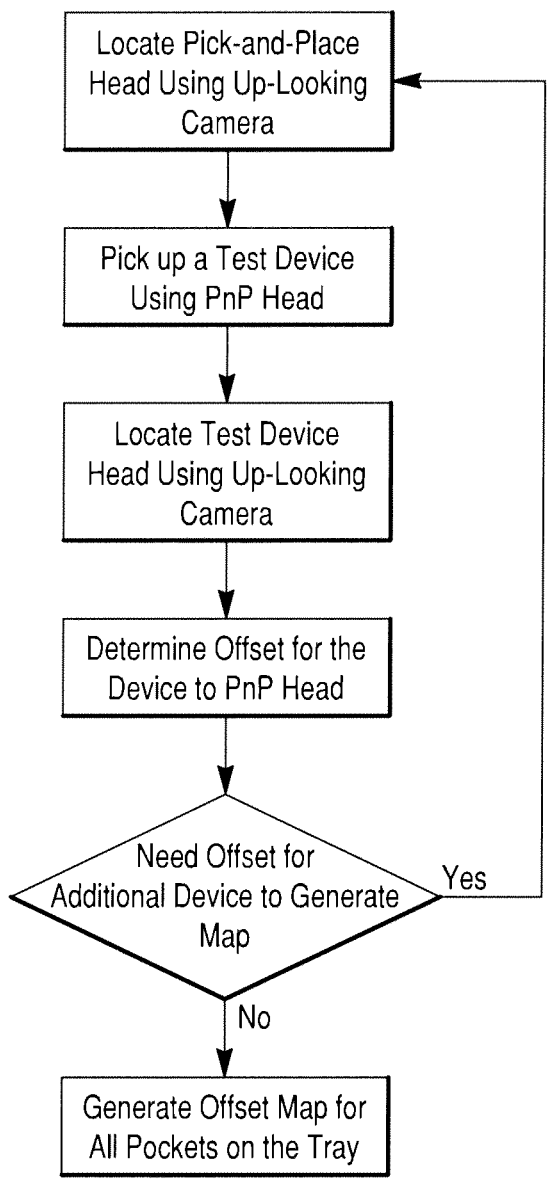
FIG. 8 is a flow chart illustrating a calibration method in accordance with embodiments of the present invention.

Referring now to FIG. 8, a method in accordance with an embodiment of the invention is illustrated. In accordance with the method of FIG. 8, the head of the pick-and-place device is located using the up-looking camera. As noted above, fiducials on the mechanical frame and on the head are within the camera's field of view and facilitate location of the head. A reference point determined by the symmetrical center of two head fiducials on the head, such as the center of the head, may be used to identify the location of the head.

The head is then used to pick up a test device from, for example, a tray of devices and is positioned above the camera while holding the test device, such as an IC device. The test device is then located using the camera. As noted above, the location of the test device uses the fiducials on the frame and a pattern corresponding to the device.

The offset of the pocket from which the test device was picked is then determined:

OFFSET(pick pocket)=OFFSET(pick device)+OFFSET(head).

As noted above, in certain embodiments, the OFFSET (pick pocket) associated with four corners of a tray or shuttle are determined. Thus, the steps above are repeated for each corner. Once the offset for the four corners is determined, an offset map may be generated using, for example, linear transform with Least Mean Square (LMS) best fitting model.

Figure 9:
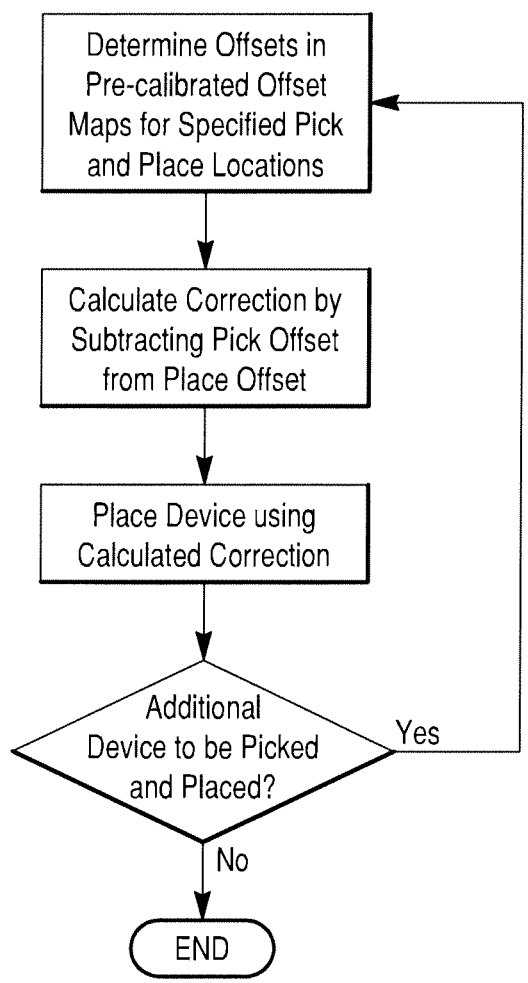
FIG. 9 is a flow chart illustrating an alignment method in accordance with embodiments of the present invention.

Referring now to FIG. 9, an embodiment of a method for runtime correction of pick-and-place alignment is illustrated. During runtime, devices may be picked from a shuttle and placed in a tray or vice versa. In this regard, the head of the pick-and-place device is positioned to pick up a device from a pick location, such as a pocket of a tray or shuttle, for placement in a place location, which is also a pocket in a tray or shuttle. Based on the pick location and the place location, a correction is determined using a pick offset and a place offset. The offsets are based on offset maps (e.g., look-up tables) generated during calibration. The correction is applied to the nominal place location, and the head places the device in the corrected place location. The process then repeats for additional devices that are to be picked and placed.

Thus, systems according to embodiments of the present invention provide significant advantages when compared to conventional systems. For example, embodiments of the present invention provide a user-friendly automated vision alignment method for pick and place handlers using a single up-looking camera. Further, embodiments of the present invention may be used for device handlers.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. An alignment method for a pick-and-place handler device, comprising:
    (a) locating a head of the pick-and-place device using an up-looking camera;
    (b) locating a test device using the up-looking camera, the test device being picked up by the pick-and-place device from a pocket location on a tray having the test device; and
    (c) determining offset error by comparing the location of the head with the location of the test device;
    (d) repeating (a)-(c) for any other additional test devices on the tray;
    (e) using the offset errors and each pocket location of each device to map positions on the tray; and
    (f) generating an offset map for alignment correction during operation of the pick-and-place handler device.

2. The method of claim 1, wherein
    generating an offset map includes repeating (a)-(c) for a test device corresponding to each corner of the tray and mapping each corner of the tray to actual pocket location of the test device corresponding to the corner by using the offset error for each corner.

3. The method of claim 2, wherein the offset map is a look-up table.

4. The method of claim 1, wherein the head is located by using fiducials on the head of the pick-and-place device and fiducials on a fixed frame.

5. The method of claim 1, wherein locating the head includes locating a center of the head.

6. The method of claim 1, wherein locating the test device includes locating a center of the test device.

7. A pick-and-place handler apparatus, comprising:
    a pick-and-place device having a pick-and-place head and a frame, the head and the frame each having fiducials;
    an up-looking camera positioned to include the frame in a field of view of the up-looking camera; and
    a processor configured to:
        (a) locate the head using the up-looking camera;
        (b) locate a test device using the up-looking camera, the test device being picked up by the pick-and-place device from a pocket location on a tray having the test devices; and
        (c) determine offset errors by comparing the location of the head with the location of the test device;
        (d) repeating (a)-(c) for any other additional test devices on the tray;
        (e) using the offset errors and each pocket location of each device to map positions on the tray; and
        (f) generating an offset map for alignment correction during operation of the pick-and-place handler device.

8. The apparatus of claim 7, wherein
    generating the offset map by the processor includes repeating (a)-(c) for a test device corresponding to each corner of the tray and mapping each corner of the tray to actual pocket location of the test device corresponding to the corner by using the offset error for each corner.

9. The apparatus of claim 8, wherein the offset map is a look-up table.

10. The apparatus of claim 7, wherein the head is located by using fiducials on the head of the pick-and-place device and fiducials on the frame.

11. The apparatus of claim 7, wherein the processor is configured to locate each head by locating a center of each head.

12. The apparatus of claim 7, wherein the processor is configured to locate the test device by locating a center of the test device with each head.

13. The method of pick-and-place alignment of claim 1, further comprising:
    picking a device from a pick location of a device from a tray of devices;
    determining a correction for a place location based on a pick offset and a place offset, the pick offset and place offset being determined from the offset map; and
    placing the device at a corrected place location.

14. The method of claim 13, wherein the corrected place location is based on a nominal place location and the correction.

15. The method of claim 13, wherein the correction for the place location is determined by the following equations:

$$\text{a pick pocket offset} = \text{the pick offset} + \text{the head offset}; \quad 1)$$

$$\text{a place pocket offset} = \text{the place offset} + \text{the head offset}; \text{ and} \quad 2)$$

$$\text{the correction for the place location} = \text{the place pocket offset} - \text{the pick pocket offset, wherein} \quad 3a)$$

$$\text{the correction for the place location} = \text{the pick offset} + \text{the head offset} - \text{the place offset} - \text{the head offset, and wherein} \quad 3b)$$

$$\text{the correction for the place location} = \text{the place offset} - \text{the pick offset}. \quad 3c)$$

16. The apparatus of claim 7, wherein
    the processor is further configured to:
        cause the pick-and-place device to pick a device from a pick location on the tray;
        determine a correction for a place location based on a pick offset and a place offset, the pick offset and place offset being determined from the offset map; and
        place the device at a corrected place location.

17. The apparatus of claim 16, wherein the corrected place location is based on a nominal place location and the correction.

* * * * *